United States Patent
Xu et al.

(10) Patent No.: US 9,991,880 B2
(45) Date of Patent: Jun. 5, 2018

(54) DISCRETE POWER SWITCHING DEVICES WITH REDUCED COMMON SOURCE INDUCTANCE

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 156 days.

(21) Appl. No.: 15/175,339

(22) Filed: Jun. 7, 2016

(65) Prior Publication Data

US 2017/0353177 A1    Dec. 7, 2017

(51) Int. Cl.
| | |
|---|---|
| *H03K 17/04* | (2006.01) |
| *H02P 6/14* | (2016.01) |
| *H02M 1/08* | (2006.01) |
| *H03K 17/14* | (2006.01) |
| *H02P 27/06* | (2006.01) |
| *H02M 7/00* | (2006.01) |
| *H02M 1/00* | (2006.01) |

(52) U.S. Cl.
CPC .......... *H03K 17/0406* (2013.01); *H02M 1/08* (2013.01); *H02P 6/14* (2013.01); *H02M 7/003* (2013.01); *H02M 2001/0054* (2013.01); *H02P 27/06* (2013.01); *H03K 17/14* (2013.01)

(58) Field of Classification Search
CPC ....................................................... H02P 6/14
USPC ............................... 318/400.26, 400.01, 700
See application file for complete search history.

(56) References Cited

U.S. PATENT DOCUMENTS

| | | | | |
|---|---|---|---|---|
| 5,744,860 A | * | 4/1998 | Bayerer | .................. H01L 23/10 |
| | | | | 257/683 |
| 7,492,138 B2 | | 2/2009 | Zhang et al. | |
| 7,589,400 B2 | * | 9/2009 | Hozoji | .................... H01L 24/40 |
| | | | | 257/673 |

(Continued)

FOREIGN PATENT DOCUMENTS

CH          203278780 U      11/2013

OTHER PUBLICATIONS

Stueckler Franz et al, CoolMOS™ C7 650V Switch in a Kelvin Source Configuration, Application Note AN May 2013, VLO May 2013, pp. 1-10.

*Primary Examiner* — David S Luo
(74) *Attorney, Agent, or Firm* — David B. Kelley; MacMillan, Sobanski & Todd, LLC

(57) ABSTRACT

Routing of a gate signal for controlling a discrete power switching device (such as in an inverter for an electric vehicle drive) is configured to compensate for the common source inductance inherent in the switching device as a result of its integrated circuit packaging. The power device has a gate signal path via a gate pin and a power signal path via first and second power pins, wherein the gate signal path and the power signal path have a first mutual inductance. A circuit board apparatus provides a gate wiring loop juxtaposed with the power signal path, wherein the gate wiring loop and the power signal path have a second mutual inductance substantially canceling the first mutual inductance. The resulting reduction in common source inductance avoids the reductions in switching speed and the increased switching losses otherwise introduced by the common source inductance.

19 Claims, 6 Drawing Sheets

(56) References Cited

U.S. PATENT DOCUMENTS

| | | | |
|---|---|---|---|
| 8,519,561 B2* | 8/2013 | Azuma | B60L 11/04 307/112 |
| 9,035,417 B2 | 5/2015 | Reusch et al. | |
| 2013/0049814 A1 | 2/2013 | De Rooij et al. | |
| 2016/0099665 A1 | 4/2016 | Chen et al. | |

* cited by examiner

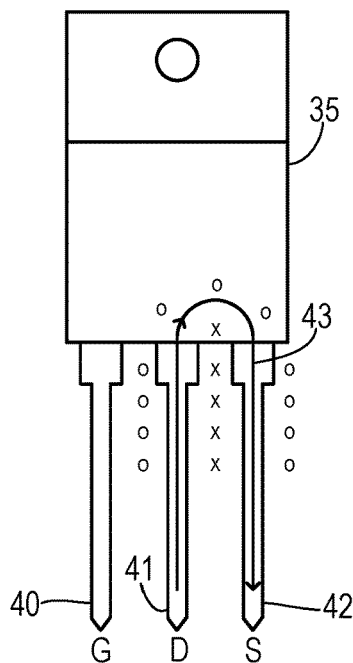
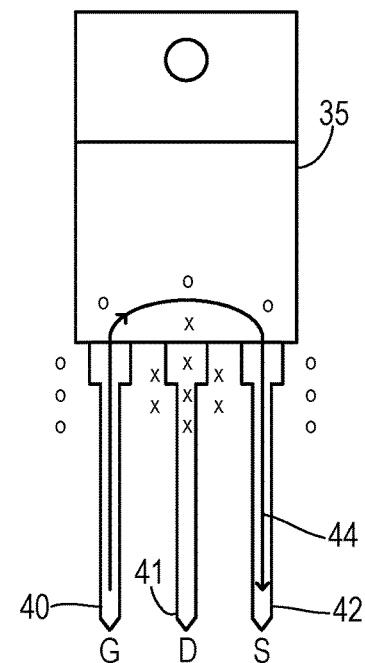
Fig. 3
Fig. 4
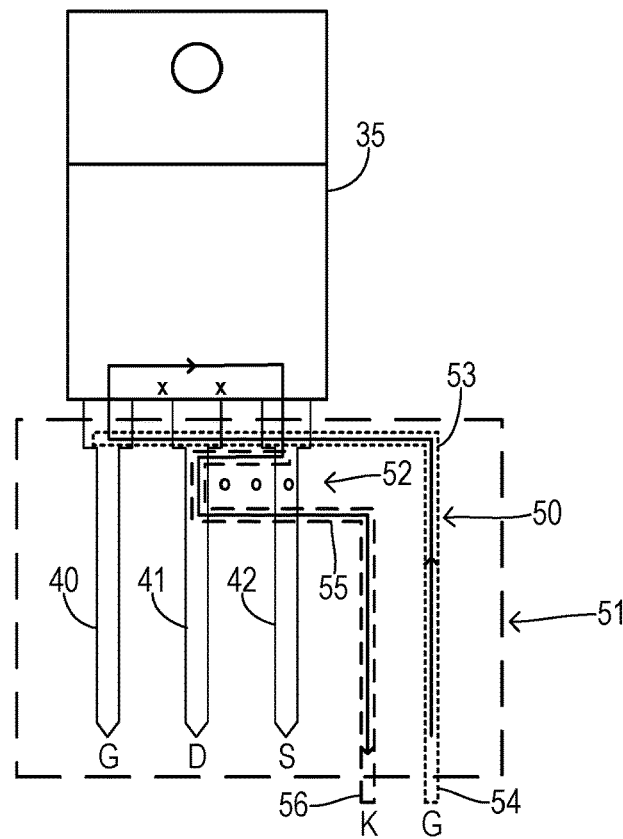
Fig. 6

DISCRETE POWER SWITCHING DEVICES WITH REDUCED COMMON SOURCE INDUCTANCE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to reducing the effects of common source inductance in discrete semiconductor power switching devices, and, more specifically, to inverter drive systems for electrified vehicles using discrete power switching devices with fast switching times and low losses.

Various types of semiconductor power switching devices have been introduced for high-voltage, high-power electronic switching applications such as power MOSFETs and insulated gate bipolar transistors (IGBTs). Due to the semiconductor die sizes and heat sinking requirements, these devices are usually contained in discrete packages mounting one or more switching devices, e.g., in a "transistor-outline" (TO) package style. The discrete power switching device packages are usually mounted to a printed circuit board that also carries ancillary electronics associated with the switching application.

Electric vehicles, such as hybrid electric vehicles (HEVs) and plug-in hybrid electric vehicles (PHEVs), employ such power switching devices to construct inverters for electric machines to provide traction torque and regenerative braking torque. A typical electric drive system includes a DC power source (such as a battery pack or a fuel cell) coupled by contactor switches to a variable voltage converter (VVC) to regulate a main bus voltage across a main linking capacitor. A first inverter is connected between the main bus and a traction motor to propel the vehicle. A second inverter may be connected between the main bus and a generator to regenerate energy during braking to recharge the battery through the VVC.

The inverters include power switching devices (most typically IGBTs) connected in a bridge configuration. An electronic controller turns the switches on and off via gate driver circuits in order to invert a DC voltage from the bus to an AC voltage applied to the motor, or to invert an AC voltage from the generator to a DC voltage on the bus. In each case, the inverters are controlled in response to various sensed conditions by varying the frequency and duty cycle at which the power devices are switched on and off.

The inverter for the motor pulse-width modulates the DC link voltage to deliver an approximation of a sinusoidal current output to drive the motor at a desired speed and torque. PWM control signals applied to the gates of the IGBTs turn them on and off as necessary so that the resulting current matches a desired current. The IGBTs and their reverse-recovery diodes have associated switching losses which must be minimized in order to limit loss of efficiency and creation of waste heat.

Common source inductance refers to an inductance shared by the main power loop (i.e., the drain-to-source or collector-to-emitter power output of the device) and the gate driver loop (i.e., gate-to-source or gate-to-emitter) in a power switching device. The common source inductance carries both the device output current (e.g., drain to source current) and the gate charging/discharging current. The voltage induced across the common source inductance modifies the gate voltage in a manner that limits the on/off switching times and increases switching losses. In a typical switching module, there are various contributors to the common source inductance which arises as a parasitic inductance associated with device packaging and printed circuit board (PCB) traces. The relative placement of current paths and the use of various structures to separate and/or block inductive coupling have been used to reduce the magnitude of the parasitic inductance that is created.

Despite the known practices, the common source inductance for discrete power devices introduced by packaging (e.g., TO-247 and TO-220) can still be as high as 10 nH. With new generations of power devices (e.g., CoolMOS, SiC, and GaN devices) becoming faster and faster, the common source inductance dramatically limits the switching speed and increases switching losses.

SUMMARY OF THE INVENTION

In one aspect of the invention, an apparatus is providing for switching a discrete power device. The power device has a gate signal path via a gate pin and a power signal path via first and second power pins, wherein the gate signal path and the power signal path have a first mutual inductance. A circuit board apparatus provides a gate wiring loop juxtaposed with the power signal path, wherein the gate wiring loop and the power signal path have a second mutual inductance substantially canceling the first mutual inductance. The resulting reduction in common source inductance avoids the reductions in switching speed and the increased switching losses otherwise introduced by the common source inductance.

BRIEF DESCRIPTION OF THE DRAWINGS

FIG. 3 is a plan view showing a magnetic flux created by a drain-to-source current in a conventional power switching device.

FIG. 4 is a plan view showing a magnetic flux created by a gate-to-source current in a conventional power switching device.

FIG. 6 is a diagram showing a re-routing of a gate signal externally of the power switching device to provide the negative coupling of the invention.

DETAILED DESCRIPTION OF PREFERRED EMBODIMENTS

Figure 1:
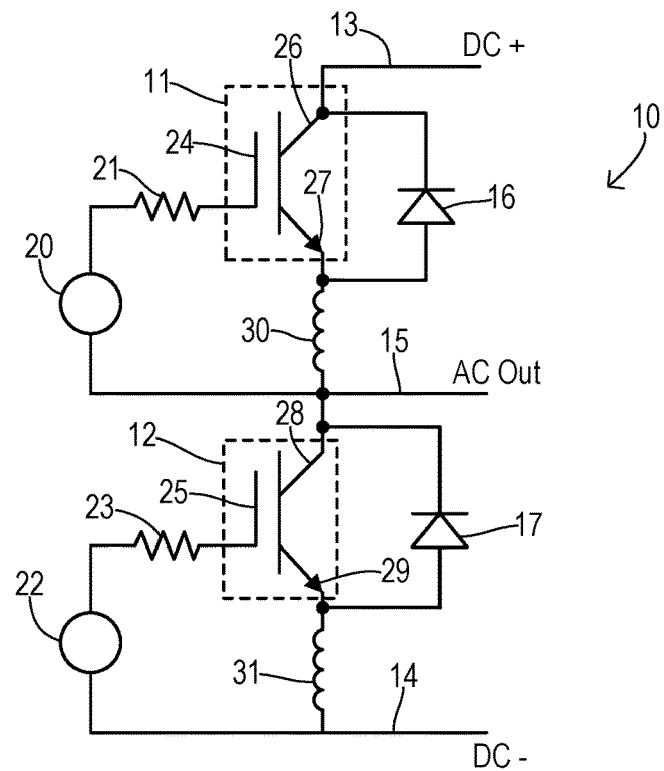
FIG. 1 is a schematic diagram showing a phase leg of an inverter using a pair of IGBTs.

Devices 11 and 12 have gate drivers 20 and 22 with respective gate coupling resistors 21 and 23 for driving respective gate terminals 24 and 25. Power output terminals 26 and 27 of device 11 and power output terminals 28 and 29 of device 12 are collector and emitter terminals when using IGBTs and are drain and source terminals when using a power MOSFET, for example. The inherent parasitic common source inductance (i.e., the mutual inductance that couples the gate current with the main device output current) is represented by inductances 30 and 31. There may be many contributors to the common source inductance including factors both inside and outside devices 11 and 12. In particular, the mutual inductance arising within devices 11 and 12 has become an increasingly significant disadvantage in the prior art.

Figure 2:
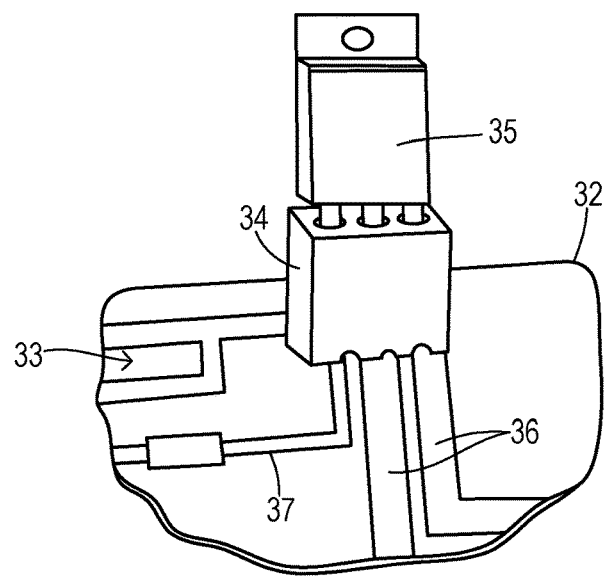
FIG. 2 is a perspective view of a power switching device in a TO package mounted to a printed circuit board via a conventional socket.

The power switching devices of the present invention may often be mounted to a printed circuit board (PCB) using a socket as shown in FIG. 2. A PCB 32 carrying traces 33 has a socket 34 soldered to the appropriate traces and configured to receive a discrete power switching device 35. Device 35 is shown having a transistor-outline (TO) style packaging with output pins in a row extending from one edge of the device. This packaging style facilitates device attachment to a heat sink after being placed within socket 34 as known in the art. Traces 33 may include enlarged traces 36 for carrying an output power signal and a trace 37 for conveying a gate signal.

FIG. 3 shows device 35 with a typical arrangement of connector pins including a gate pin 40 at one end, a drain (or collector) pin 41, and a source (or emitter) pin 42. When device 35 is turned on, an output current flows between power output pins 41 and 42 providing a power signal path 43 via pins 41 and 42 and via a main body of device 35 between pins 41 and 42. The resulting magnetic flux created by the power signal is shown, wherein X's inside the current loop of power signal path 43 represent a flux directed into the page and O's outside the current loop represent magnetic flux directed out from the page.

FIG. 4 represents a gate current flowing along a gate signal path 44 via pins 40 and 42 and within the body of device 35 between pins 40 and 42. The gate path magnetic flux is mainly coincident (i.e., positively coupled) with the magnetic flux from the power signal path. Thus, there is a mutual inductance with a net positive coupling.

Figure 5:
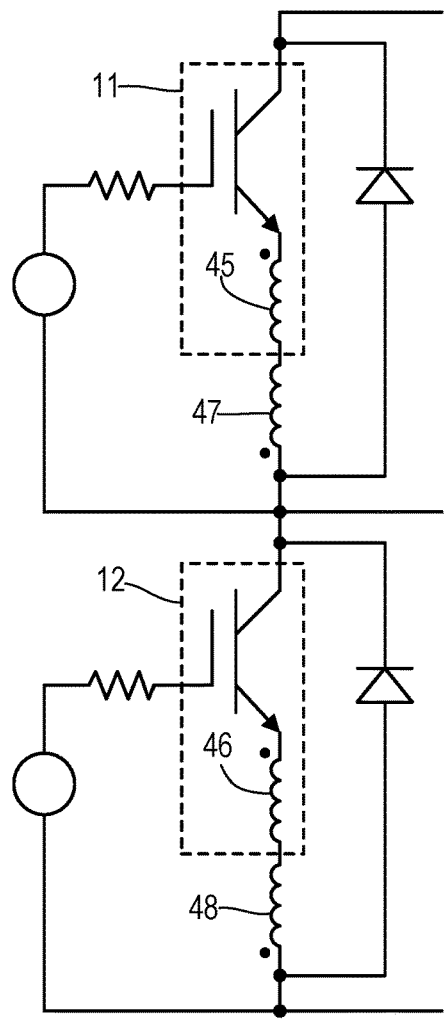
FIG. 5 is a schematic diagram showing an added mutual inductance with a negative coupling which cancels the inherent common source inductance of the switching device.

Due to the arrangement of the structures (including but not limited to the pin arrangement) associated with the power switching device, the common source inductance generated internally of the discrete power switching devices is unavoidable in any currently available discretely packaged power switching devices. In order to avoid the reduced performance associated with this internal common source inductance, the present invention cancels the positive coupling inherent in the device by adding an external mutual inductance with an opposite coupling. As shown in FIG. 5, inductances 45 and 46 represent the inherent common source inductances associated with the device packaging. The present invention adds mutual inductances 47 and 48 externally of, but close to, devices 11 and 12, respectively, wherein the added inductances are negatively coupled (i.e., have opposite polarity) with respect to the inherent mutual inductance. Since the power switching device typically has a positive coupling of the gate signal path with the power signal path (i.e., the mutual voltage has the same polarity as the mutual current), the added mutual inductance typically provides a negative coupling so that the internal mutual inductance is substantially or fully canceled. In particular, a spatial wiring pattern of the gate signal leading into the discrete device is laid out as a loop that interacts with the power signal path in a manner that results in substantially no net coupling between the gate signal path and the power signal path. As used herein, substantially canceled means that the effects of the mutual inductance inherent in the discrete device are mitigated by greater than about 50%.

FIG. 6 shows a gate wiring loop 50 which is provided by a circuit board apparatus 51 juxtaposed with discrete power switching device 35 near its power signal path (e.g., power pins 41 and 42). Circuit board apparatus 51 can be comprised of an auxiliary socket for attaching device 35 with a printed circuit board (PCB) or can be comprised of a particular arrangement of conductive traces on a PCB, for example. In order to substantially cancel a first mutual inductance of the power signal path (e.g., positive coupling), gate wiring loop 50 is laid out in a manner to provide one or more winding turns 52 with a winding direction opposite a loop formed by the gate signal path inside device 35 (between the gate and source pines) overlapping the power signal path. A magnetic flux in winding turns 52 is shown as being opposite to the magnetic flux generated internally in device 35 and opposite to the magnetic flux generated by the power signal path.

Figure 7:
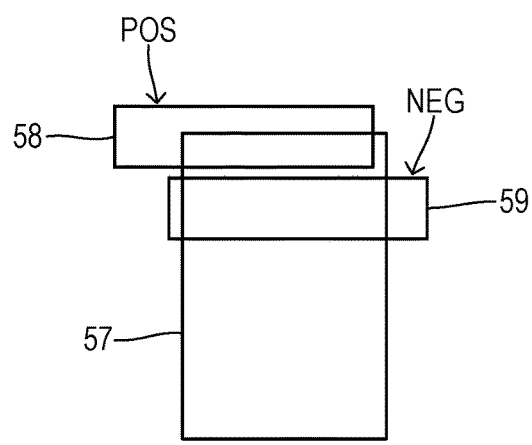
FIG. 7 is a diagram showing overlapping magnetic flux patterns corresponding to FIG. 6.

In order to provide the desired winding direction opposite of the winding direction of the inherent, unchangeable portion of the gate signal path inside device 35, gate wiring loop 50 may include a gate terminal leg 53 spanning device pins 40-42 and a source terminal leg 55 defining a winding turn spanning device power pins 41 and 42. In a preferred embodiment when circuit board apparatus 51 is comprised of an auxiliary socket, a separate gate connection 54 separate from and laterally offset from gate pin 40 and a Kelvin source connection 56 separate from and laterally offset from source pin 42 may extend from the auxiliary socket to facilitate the desired placement of winding loop 50. The use of a Kelvin source is a known technique wherein the contributory gate current appearing in the device output is separated from the main power output current flowing between the device drain and source terminals FIG. 7 shows magnetic flux associated with the discrete power device in the present invention. Thus, a first magnetic flux region 57 is generated by an output current of the device along the power signal path. A magnetic flux region 58 generated by the internal, inherent gate signal path within the device has a positive coupling with region 57. The gate wiring loop generates a negatively coupled magnetic flux region 59. By configuring the gate wiring loop to generate a magnetic flux with an equal and opposite coupling, the invention achieves no net mutual inductance between the gate current and the power output current, thereby speeding up device switching and reducing switch losses.

Figure 8:
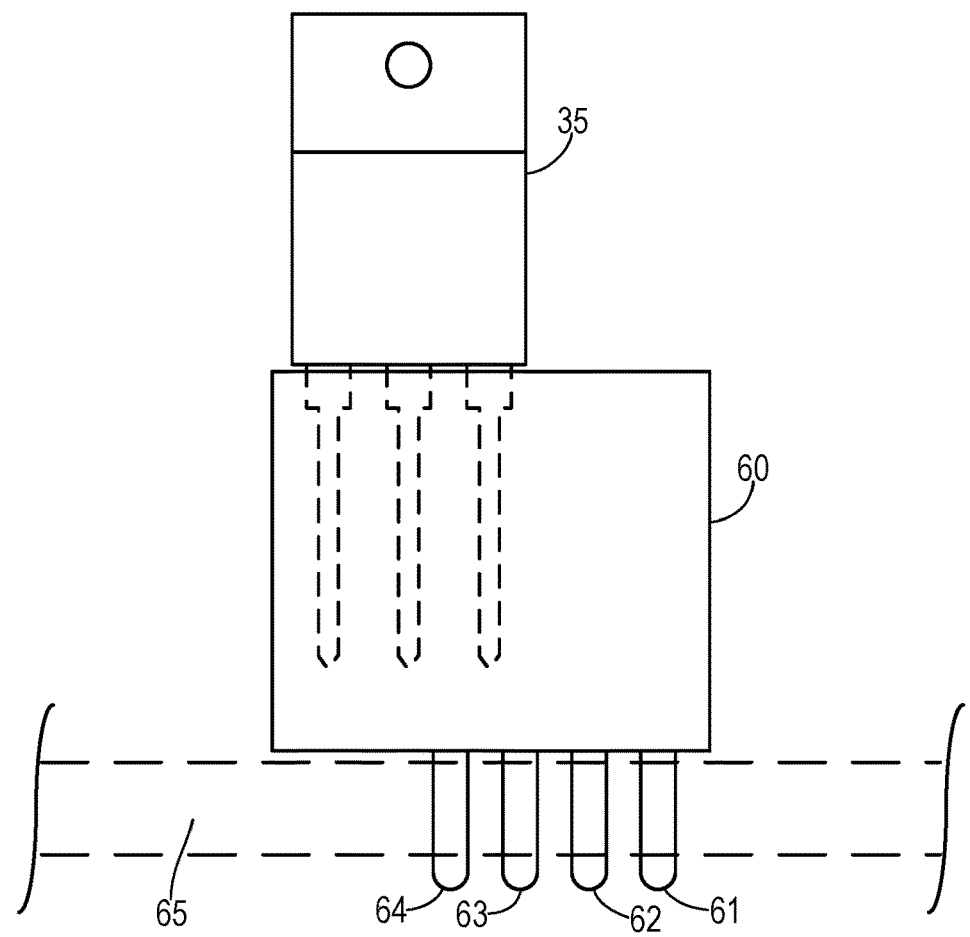
FIG. 8 shows an auxiliary socket of the invention mounting a power switching device to a printed circuit board.

FIG. 8 shows a preferred embodiment wherein the circuit board apparatus is comprised of an auxiliary socket 60 which can receive device 35 and is adapted to mount to a circuit board 65 via a plurality of socket pins 61-64. Auxiliary socket 60 has an outer profile which is adapted to contain any three dimensional desired gate wiring loop. In particular, the profile may be offset from a side of device 35, for example. Pin 61 may be a gate pin, pin 62 may be a Kelvin source pin, and pin 63 may be an output source pin, and pin 64 may be an output drain pin. Auxiliary socket 60 may have an orientation which places device 35 either vertically or horizontally with respect to the plane of PCB 65.

Figure 9:
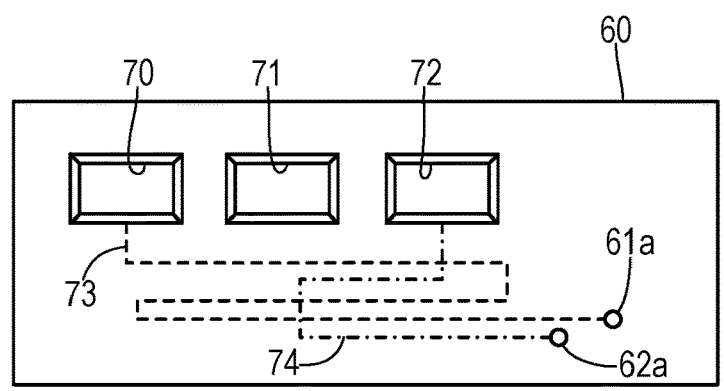
FIG. 9 is a top view of the auxiliary socket of FIG. 8.

FIG. 9 shows a top view of auxiliary socket 60 including a gate receptacle 70, a drain receptacle 71, and a source receptacle 72 for receiving a gate pin, drain pin, and source pin of the discrete power switching device, respectively. Auxiliary socket 60 has embedded conductors for forming the gate wiring loop. The conductors include a first embedded conductor 73 connected at one end with gate receptacle 70 and at the other end with a gate pin connection 61a. A second embedded conductor 74 is connected between source socket 72 and a Kelvin source pin connection 62a.

Figure 10:
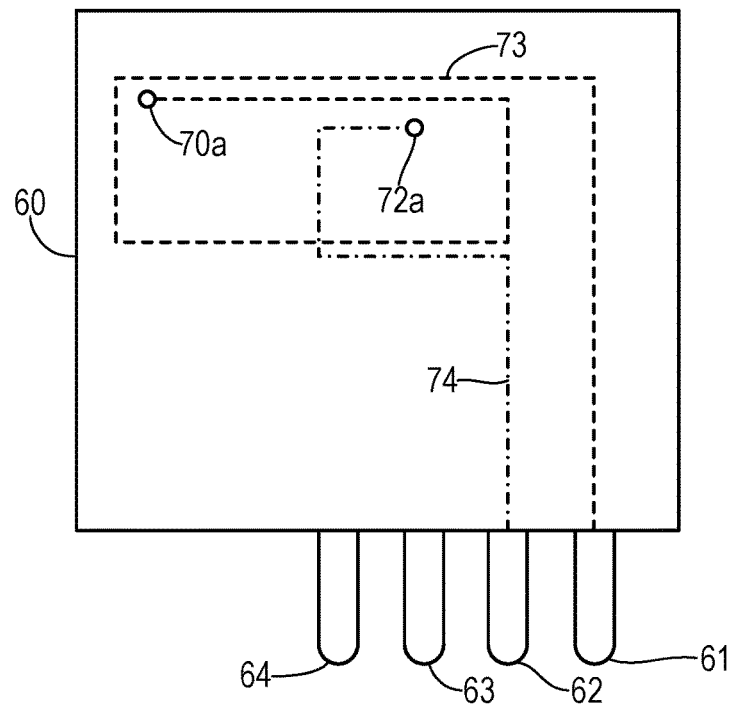
FIG. 10 is a front view of the auxiliary socket of FIG. 8.
Figure 11:
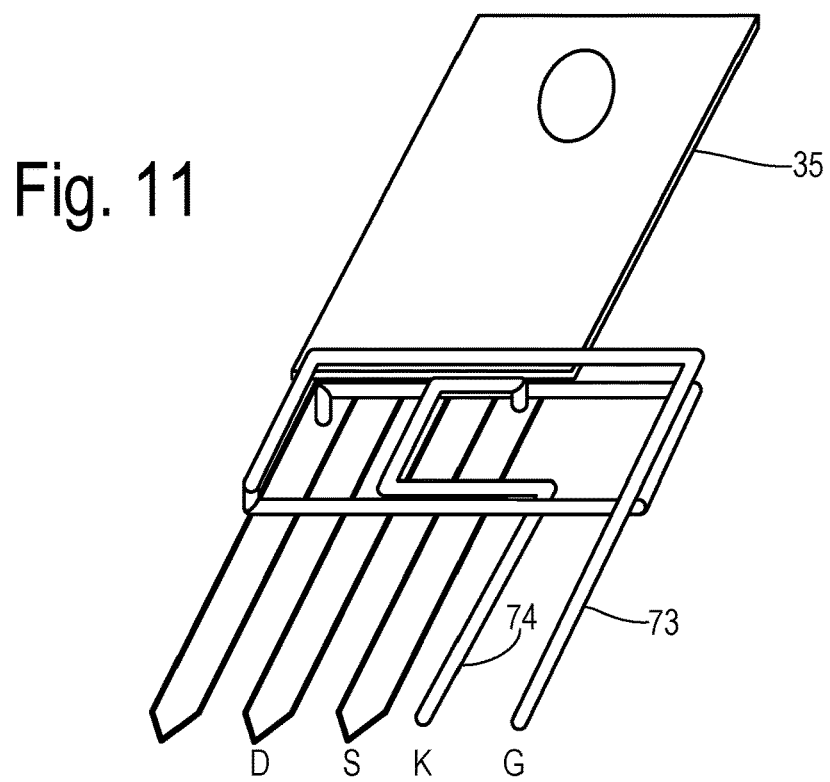
FIG. 11 is a perspective view showing a layout of embedded conductors in the auxiliary socket of FIG. 8.

The layout of the embedded conductors is further shown in the front view of FIG. 10. Conductor 73 extends from pin 61 through about 1½ turns to a gate socket connection 70a, and conductor 74 extends from pin 62 through about ½ turn to a Kelvin source connection 72a, such that the turn direction of the cooperatively-formed winding turns generate a negative coupling with the power signal path. FIG. 11 is a perspective view showing the three-dimensional arrangement of embedded conductor 73 and 74 in greater detail. Preferably, auxiliary socket 60 has a main plastic body which may be molded over the embedded conductors, or may include internal passages into which the conductors are inserted. Preferably, auxiliary gate pin 61 is laterally offset from the power switching device's gate pin to allow the gate wiring loop to pass over the power signal path as shown. When auxiliary socket 60 is mounted to PCB 65, pins 61 and 62 become interconnected with a gate driver (not shown) while pins 63 and 64 become connected to the inverter input and output rails.

In an alternative embodiment, the circuit board apparatus is comprised of a printed circuit board which carries conductive traces adapted to configure a portion of the power signal path and the gate wiring loop with a layout that creates the negatively-coupled mutual inductance for canceling the first mutual inductance at the board itself regardless of whether a socket is used for the power switching device.

Figure 12:
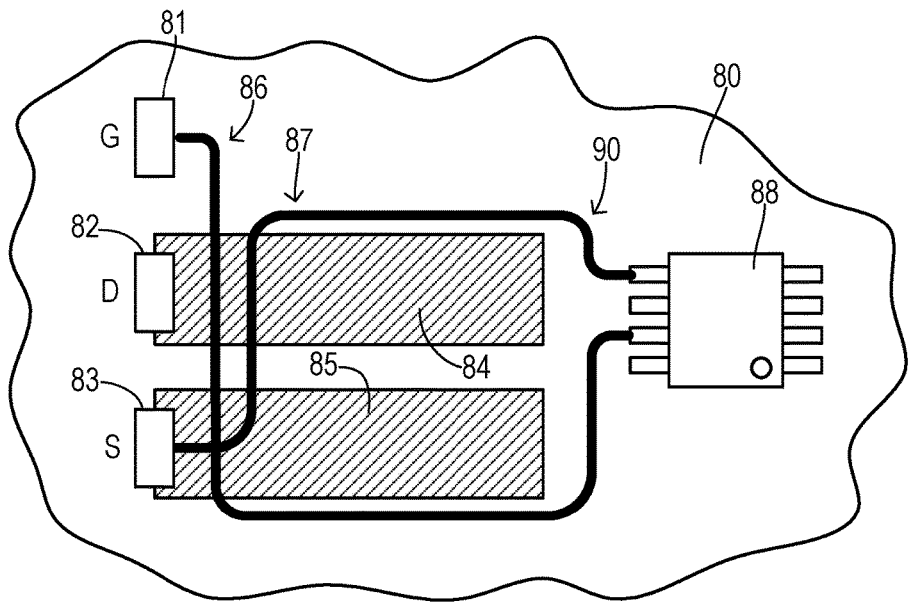
FIG. 12 is a top view showing PCB traces for one embodiment of a gate wiring loop of the invention.

As shown in FIG. 12, a PCB substrate 80 (preferably a multilayer substrate) receives the power switching device such that the device terminal pins are connected to a gate pad 81, drain pad 82, and source pad 83. Power traces 84 and 85 are disposed on the substrate 80 in series with drain and source pads 82 and 83, thereby forming a portion of the power signal path. A gate trace 86 extends from gate pad 81 to a gate driver circuit 88 comprised of an integrated circuit also mounted to PCB substrate 80. A Kelvin source trace 87 is disposed on substrate 80 and connects source pad 83 to a respective terminal on gate driver circuit 88. Gate trace 86 and Kelvin source trace 87 cross over (and are insulated from) power traces 84 and 85 to form the gate wiring loop 90 in order to produce the negatively-coupled mutual inductance for canceling the common source inductance inherent in the switching device. The loop size and number of turns for traces 86 and 87 is tuned to provide a desired negative coupling with a magnitude selected to substantially cancel the first mutual inductance seen at the device pins connected to pads 81-83. Furthermore, the printed circuit board is comprised of multiple layers including conductive and insulating layers, whereby traces 86 and 87 define a desired plurality of winding turns using the plurality of multiple layers.

Figure 13:
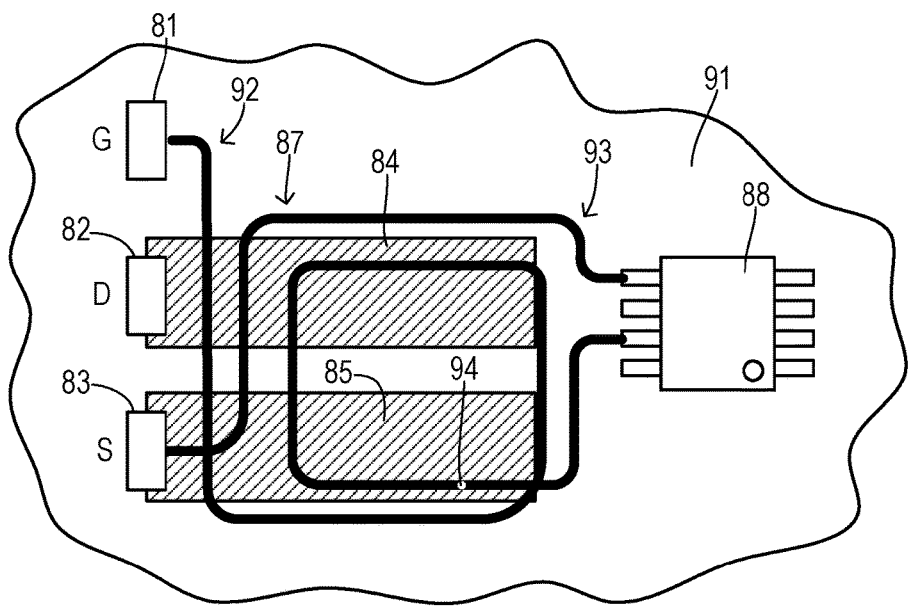
FIG. 13 is a top view showing PCB traces for another embodiment of a gate wiring loop of the invention.

In a further example shown in FIG. 13, a substrate 91 carries a gate wiring loop 93 with additional turns. A gate trace 92 defines multiple turns, wherein a via 94 interconnects different layers in order to connect different sections of the multiple turns.

What is claimed is:

1. Apparatus comprising;
   a discrete power device with a gate signal path via a gate pin and a power signal path via first and second power pins, the device signal paths having a positively-coupled mutual inductance; and
   circuit board apparatus providing a gate wiring loop juxtaposed with the power signal path, the gate wiring loop and the power signal path having a negatively-coupled mutual inductance substantially canceling the positively-coupled mutual inductance.

2. The apparatus of claim 1 wherein the power device comprises an insulated gate bipolar transistor in a transistor-outline power package.

3. The apparatus of claim 1 wherein the gate wiring loop defines a plurality of winding turns.

4. The apparatus of claim 1 wherein the circuit board apparatus is comprised of an auxiliary socket receiving the power device and adapted to mount on a printed circuit board.

5. The apparatus of claim 4 wherein the auxiliary socket is comprised of a plastic body with a plurality of embedded conductors forming the gate wiring loop.

6. The apparatus of claim 5 wherein the auxiliary socket includes an auxiliary gate pin extending from the plastic body and laterally offset from the power device gate pin.

7. The apparatus of claim 6 wherein the auxiliary socket includes a Kelvin source pin extending from the plastic body and connected to one of the power pins, and wherein the Kelvin source pin and the auxiliary gate pin are adapted to be further connected to a gate driver.

8. The apparatus of claim 7 wherein a first portion of the gate wiring loop is connected between the power device gate pin and the auxiliary gate pin, and wherein a second portion of the gate wiring loop is connected between the one power pin and the Kelvin source pin.

9. The apparatus of claim 1 wherein the circuit board apparatus is comprised of a printed circuit board having the power device mounted thereon, wherein the apparatus further comprises a gate driver circuit mounted on the printed circuit board, and wherein the printed circuit board is comprised of:
   a substrate;
   a pair of power traces disposed on the substrate in series with the power signal path;
   a gate trace connecting the power device gate pin to the gate driver circuit; and
   a Kelvin source trace connecting one of the power pins to the gate driver circuit;
   wherein the gate trace and the Kelvin source trace cross over the power traces to form the gate wiring loop having the second mutual inductance.

10. The apparatus of claim 9 wherein the printed circuit board is comprised of multiple layers, and wherein the gate trace and the Kelvin source trace cooperatively define a plurality of winding turns using a plurality of the multiple layers.

11. An inverter for driving a traction motor of an electric vehicle, comprising:
   a plurality of discrete semiconductor power switching devices interconnected in a bridge configuration to invert a DC input to an AC output for driving the traction motor, wherein each power device has a respective gate signal path via a respective gate pin and a respective power signal path via respective first and second power pins, the respective gate signal path and the respective power signal path having a respective first mutual inductance with a positive coupling; and circuit board apparatus providing a plurality of respective gate wiring loops each juxtaposed with a respective power signal path, the respective gate wiring loop and the respective power signal path having a respective second mutual inductance with a negative coupling substantially canceling the respective first mutual inductance.

12. The inverter of claim 11 wherein each power device comprises an insulated gate bipolar transistor in a transistor-outline power package.

13. The inverter of claim 11 wherein the circuit board apparatus is comprised of a plurality of auxiliary sockets each receiving a respective power device and adapted to mount on a printed circuit board.

14. The inverter of claim 13 wherein each auxiliary socket is comprised of a plastic body with a plurality of embedded conductors forming the respective gate wiring loop.

15. The inverter of claim 14 wherein each auxiliary socket includes an auxiliary gate pin extending from the plastic body and laterally offset from the respective power device gate pin.

16. The inverter of claim 15 wherein each auxiliary socket includes a respective Kelvin source pin extending from the respective plastic body and connected to one of the respective power pins, and wherein each Kelvin source pin and each auxiliary gate pin are adapted to be further connected to a respective gate driver.

17. The inverter of claim 11 wherein the circuit board apparatus is comprised of a printed circuit board having the power devices mounted thereon, wherein the inverter further comprises a plurality of gate driver circuits mounted on the printed circuit board, and wherein the printed circuit board is comprised of:

a substrate;

a respective pair of power traces disposed on the substrate in series with each respective power signal path;

a respective gate trace connecting each respective power device gate pin to the respective gate driver circuit; and a respective Kelvin source trace connecting one of the respective power pins to the respective gate driver circuit;

wherein each respective gate trace and respective Kelvin source trace cross over the respective power traces to form each respective gate wiring loop having the respective second mutual inductance.

18. The inverter of claim 11 wherein the printed circuit board is comprised of multiple layers, and wherein the respective gate traces and the respective Kelvin source traces cooperatively define a plurality of winding turns for each respective gate wiring loop using a plurality of the multiple layers.

19. Apparatus comprising;

a discrete power device with a gate signal path via a gate pin and a power signal path via two power pins, the paths having a positive inductive coupling; and an auxiliary socket receiving the power device and mounted on a circuit board having a gate wiring loop juxtaposed with the power signal path, the gate loop and the power signal path having a negative inductive coupling substantially canceling the positive coupling.

* * * * *